(12) United States Patent
Ishihara

(10) Patent No.: US 11,161,947 B2
(45) Date of Patent: Nov. 2, 2021

(54) ELECTROMAGNETIC WAVE SUPPRESSION SHEET

(71) Applicant: Kitagawa Industries Co., Ltd., Inazawa (JP)

(72) Inventor: Taichi Ishihara, Kasugai (JP)

(73) Assignee: Kitagawa Industries Co., Ltd.

( * ) Notice: Subject to any disclaimer, the term of this patent is extended or adjusted under 35 U.S.C. 154(b) by 169 days.

(21) Appl. No.: 16/635,984

(22) PCT Filed: Jul. 9, 2018

(86) PCT No.: PCT/JP2018/025889
§ 371 (c)(1),
(2) Date: Jan. 31, 2020

(87) PCT Pub. No.: WO2019/026555
PCT Pub. Date: Feb. 7, 2019

(65) Prior Publication Data
US 2021/0147644 A1 May 20, 2021

(30) Foreign Application Priority Data
Jul. 31, 2017 (JP) .............................. JP2017-147964

(51) Int. Cl.
*C08J 5/10* (2006.01)
*C08K 5/524* (2006.01)
*C08L 23/28* (2006.01)
*C08K 3/105* (2018.01)
*C08K 3/11* (2018.01)
*C08K 3/22* (2006.01)
*C08K 3/34* (2006.01)
*C08K 9/10* (2006.01)

(52) U.S. Cl.
CPC ................. *C08J 5/10* (2013.01); *C08K 3/105* (2018.01); *C08K 3/11* (2018.01); *C08K 3/22* (2013.01); *C08K 3/34* (2013.01); *C08K 5/524* (2013.01); *C08K 9/10* (2013.01); *C08L 23/286* (2013.01); *C08J 2323/28* (2013.01); *C08K 2003/2227* (2013.01); *C08K 2003/2265* (2013.01)

(58) Field of Classification Search
CPC .............................. C08K 5/524; C08L 23/286
See application file for complete search history.

(56) References Cited

U.S. PATENT DOCUMENTS 3,872,041 A * 3/1975 Koerber .................. C08L 63/00
524/114
6,972,097 B2 * 12/2005 Yoshida ..................... H01F 1/22
252/62.54

FOREIGN PATENT DOCUMENTS

| JP | 2003-332113 | 11/2003 |
| JP | 2005-183864 | 7/2005 |
| WO | WO 2010/024166 | 3/2010 |
| WO | WO 2013/061918 | 5/2013 |

OTHER PUBLICATIONS

Machine translation of JP 2003-332113, published Nov. 21, 2003.*

* cited by examiner

*Primary Examiner* — Vickey Nerangis
(74) *Attorney, Agent, or Firm* — Thorpe North & Western

(57) ABSTRACT

Provided is an electromagnetic wave suppression sheet that contains from 400 to 600 parts by weight of a metal magnetic powder having an oxidized coating film formed on a surface thereof, from 1 to 15 parts by weight of a chelating agent, and from 1 to 10 parts by weight of an anti-aging agent, per 100 parts by weight of chlorinated polyethylene.

2 Claims, 1 Drawing Sheet

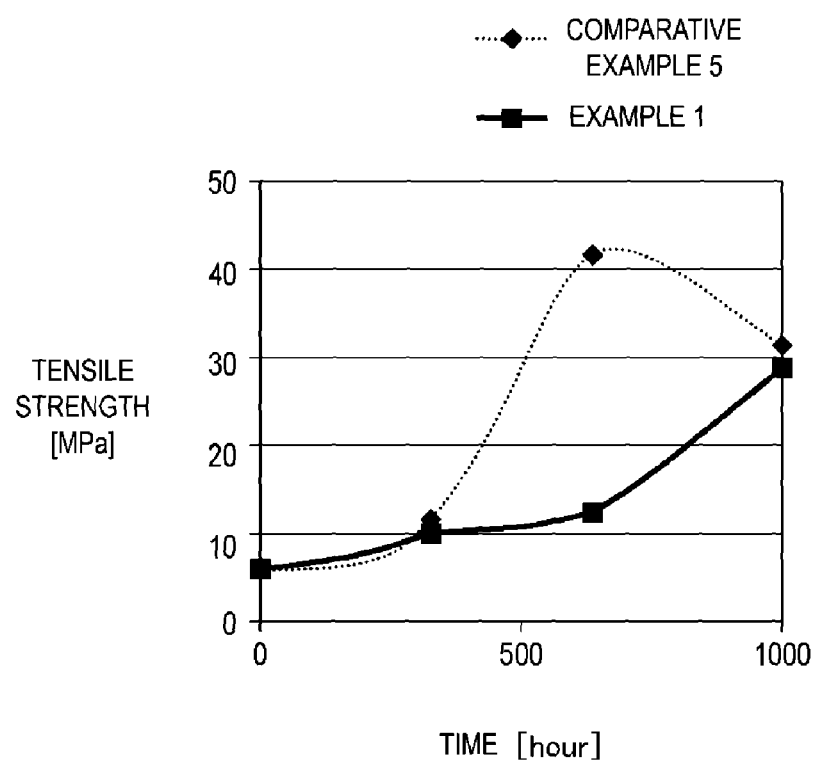

ELECTROMAGNETIC WAVE SUPPRESSION SHEET

TECHNICAL FIELD

The present technology relates to an electromagnetic wave suppression sheet.

BACKGROUND ART

Typically, electromagnetic wave suppression sheets used in applications such as portable devices and digital cameras are formed by kneading a metal magnetic powder having magnetic permeability together with an organic binder, and then rolling the mixture using, for example, a roller to form a sheet. As the organic binder, an elastomer rubber such as acrylic rubber, urethane rubber, chlorinated polyethylene, and EPDM (ethylene propylene diene monomer), and resins such as polyethylene, acrylic, and nylon can be used, but chlorinated polyethylene is widely used from the perspectives of flame retardancy, moldability, and high filling properties.

However, when an electromagnetic wave suppression sheet that uses chlorinated polyethylene as the binder is used continuously in a high temperature environment, the chlorinated polyethylene and metal magnetic powder may react and generate a gas. When a gas is generated in this manner, the sheet swells, and there is a risk that the housing of an electronic device on which the sheet is disposed or a substrate inside the housing or the like may be compressed, resulting in damage to the device.

SUMMARY

The present technology obtains an electromagnetic wave suppression sheet that is not prone to swelling even when used in a high temperature environment, and that excels in an electromagnetic wave suppressing effect.

The present technology provides an electromagnetic wave suppression sheet containing: (A) 100 parts by weight of chlorinated polyethylene; (B) from 400 to 600 parts by weight of a metal magnetic powder having an oxidized coating film formed on a surface thereof; and (C) from 1 to 15 parts by weight of a chelating agent.

The oxygen content of the metal magnetic powder (B) is preferably from 0.4 to 1.1 wt. %, and the electromagnetic wave suppression sheet preferably further contains from 1 to 10 parts by weight of an anti-aging agent.

According to the present technology, an electromagnetic wave suppression sheet that is not prone to swelling even when used in a high temperature environment, and that excels in an electromagnetic wave suppressing effect can be obtained.

Other characteristics and advantages of the present technology will become apparent from the following description with reference to the accompanying drawings.

BRIEF DESCRIPTION OF DRAWINGS

The accompanying drawings are included in the specification, constitute a part thereof, and illustrate embodiments of the present technology, and together with the description, the drawings are used to explain the principles of the present technology.

The Drawing is a graph illustrating a change in tensile strength.

DETAILED DESCRIPTION

Embodiments of the present technology will be described below in detail. The present technology is based on the discovery that with respect to electromagnetic wave suppression sheets in which a metal magnetic powder is kneaded with chlorinated polyethylene and formed into a sheet, when the metal magnetic powder used is provided with an oxidized coating film, and a chelating agent is added, the resulting electromagnetic wave suppression sheet is less prone to swelling even when exposed to a high temperature environment for a long period of time, and also excels in magnetic permeability.

When the principle of the present technology is speculated, it is thought that the swelling that occurs when a typical electromagnetic wave suppression sheet is used in a high temperature environment is caused by the generation of gas when the chlorinated polyethylene reacts with the metal magnetic powder.

Therefore, in order to inhibit the reaction between the metal magnetic powder and the chlorinated polyethylene, the metal magnetic powder is covered with an oxidized coating film. It is presumed that ionization of the metal is suppressed by the oxidized coating film, and the generation of gas due to the reaction between the metal magnetic powder and the chlorinated polyethylene in a high temperature environment is suppressed.

Incidentally, when the thickness of the oxidized coating film is small, the reaction between the metal magnetic powder and the chlorinated polyethylene cannot be sufficiently inhibited. On the contrary, when the oxidized coating film is too thick, the magnetic permeability of the sheet decreases, which is a problem. That is, it is difficult to obtain a sufficient effect on both the swelling and magnetic permeability of the sheet by only adjusting the thickness of the oxidized coating film.

Thus, the present technology was configured with the further addition of a chelating agent. It is speculated that even if the thickness of the oxidized coating film is not sufficient and metal ions are generated, the chelating agent forms a metal complex, which thus suppresses the reaction with the chlorinated polyethylene, and as a result, the generation of gas can be suppressed.

Incidentally, in order to obtain an effect of suppressing the reaction between the metal magnetic powder and the chlorinated polyethylene with only a chelating agent, the chelating agent must be added at an amount equivalent to that of the metal magnetic powder. However, in such a case, the compounding ratio of the metal magnetic powder in the entire sheet decreases, and thus the magnetic permeability also decreases, which is a problem.

In response to this problem, according to the present technology, an electromagnetic wave suppression sheet that can maintain a high level of magnetic permeability while suppressing the generation of gas in a high temperature environment can be obtained by providing an oxidized coating film on the surface of a metal magnetic powder and using a chelating agent in combination.

The addition amount of the metal magnetic powder is preferably within a range from 400 to 600 parts by weight per 100 parts by weight of the chlorinated polyethylene. By adding the metal magnetic powder at this compounding ratio, an electromagnetic wave suppression sheet that excels in heat resistance and is not prone to swelling can be obtained.

More specifically, when the content of the metal magnetic powder is 400 parts by weight or greater, a desired level of magnetic permeability can be obtained. Note that in the present technology, the desired magnetic permeability is 75 or greater. On the other hand, the finished product can be obtained in a sheet shape when the content of the metal magnetic powder is not greater than 600 parts by weight.

Furthermore, the addition amount of the chelating agent is preferably within a range from 1 to 15 parts by weight per 100 parts by weight of chlorinated polyethylene. By adding the chelating agent at this compounding ratio, an electromagnetic wave suppression sheet that excels in heat resistance and is not prone to swelling can be obtained.

More specifically, when the content of the chelating agent is 1 part by weight or greater, swelling does not occur, and therefore the reaction between the metal magnetic powder and the chlorinated polyethylene is suppressed. On the other hand, the finished product can be shaped into a sheet when the content of the chelating agent is not greater than 15 parts by weight.

Furthermore, when the content of the chelating agent is set to the above-described range from 1 to 15 parts by weight, degradation of the chlorinated polyethylene is prevented, thereby exhibiting an effect that the electromagnetic wave suppression sheet according to the present technology can maintain the flexibility over an extended period of time.

The thickness of the oxidized coating film is evaluated according to the oxygen content in the metal magnetic powder. The oxygen content of the metal magnetic powder is preferably from 0.4 to 1.1 wt. %.

More specifically, the reaction between the metal magnetic powder and the chlorinated polyethylene is suppressed when the oxygen content is not less than 0.4 wt. %. On the other hand, when the oxygen content is not greater than 1.1 wt. %, a desired level of magnetic permeability can be obtained. Note that a larger number indicates a greater film thickness of the oxidized coating film.

In addition, as the metal magnetic powder, a metal magnetic powder having high magnetic permeability, such as a Fe—Si—Al alloy (Sendust), a Fe—Cr—Al alloy, a Fe—Si alloy, and a Fe—Ni alloy (Permalloy), can be selected.

Furthermore, the oxidized coating film can be formed by heating the metal magnetic powder in an oxygen containing atmosphere at a temperature that does not reach its sintering temperature. The film thickness can be adjusted by managing the heating temperature and time. The heating is achieved using a known method, and the heating temperature and heating time are appropriately set according to the film thickness to be obtained and the method.

The oxidized coating film obtained in such a condition is formed from the metal magnetic powder surface and is sequentially thickened (oxidized) from the surface side, and therefore the film thickness can be uniquely indicated as "film thickness=wt. % (of the metal magnetic powder)". In addition, the film thickness of the oxidized coating film can be indicated by wt. % (of the metal magnetic powder) because they are in a positive proportional relationship.

Furthermore, a phosphorus-based chelating agent is preferably used as the chelating agent.

An anti-aging agent may be further added. Examples of the anti-aging agent include phosphorous-based, phenol-based, amine-based, sulfur-based, and imidazole-based anti-aging agents, and of these, a phosphorous-based anti-aging agent is preferably used. Examples of phosphorous-based anti-aging agents include tris(nonylphenyl) phosphite as a phosphorous acid-based anti-aging agent. Note that a plurality of types of anti-aging agents may be used in a mixture. The anti-aging agent is preferably added at an amount in a range from 1 to 10 parts by weight per 100 parts by weight of the chlorinated polyethylene.

Furthermore, other additives such as a flame retardant and a stabilizing agent may be added.

EXAMPLES

Sendust (Fe—Si—Al alloy) with a D50 (50% cumulative frequency) from 33 to 55 μm which was atomized by an inert gas and flattened was subjected to a heating treatment (including a degreasing treatment) for 1 hour, 2 hours, 4 hours or 5 hours at a temperature of approximately 600 degrees in an oxygen containing atmosphere, and four types of metal magnetic powders having an oxidized coating film with different thicknesses formed on the surface were obtained. These metal magnetic powders were each kneaded with a binder and other materials at the compounding ratios described below, and the mixtures were each shaped into a sheet having a thickness of 0.5 mm to thereby produce electromagnetic wave suppression sheets (Comparative Examples 1 to 4).

Chlorinated polyethylene: 100 parts by weight
Metal magnetic powder: 500 parts by weight
Phosphorous-based anti-aging agent: from 1 to 10 parts by weight Samples for measurement were cut from the obtained four types of sheets into a ring shape with an outer diameter of 18 mm and an inner diameter of 6 mm, and the magnetic permeability of each sample at 1 MHz was measured using an impedance analyzer E4991A and magnetic material fixture (Model No.: 16454A) available from Agilent Technologies. Heat resistance tests were then performed in a high temperature atmosphere at 105 degree, and the rate of thickness change of each sample before and after the test was examined.

The measurement results are shown in Table 1.

TABLE 1

| | Metal Magnetic Powder | | Compounding | | | | |
| --- | --- | --- | --- | --- | --- | --- | --- |
| | 600° C. Heating Duration (h) | Oxygen Content (wt. %) | Compounding Ratio (parts by weight) | Ratio of Chelating Agent (parts by weight) | Magnetic Permeability (1 MHz) | Duration for 105° C. Heat Resistance Test (h) | Thickness Change Rate (%) |
| Comparative Example 1 | 1 | 0.4 | 500 | — | 75 | 160 | +9.2 |
| Comparative example 2 | 2 | 0.7 | 500 | — | 75 | 64 | +26.4 |
| Comparative Example 3 | 4 | 1.2 | 500 | — | 65 | 1000 | +1.0 |
| Comparative Example 4 | 5 | 1.5 | 500 | — | 60 | 1000 | +0.6 |

The oxygen content (wt. %) shown in Table 1 is a measured value for each metal magnetic powder (metal magnetic powder with an oxidized coating film formed thereon) subjected to a heating treatment, and the magnetic permeability is a measured value for the produced electromagnetic wave suppression sheet prior to the heat resistance test.

The oxygen content was measured using an inert gas fusion-nondispersive infrared absorptiometry (EMGA-920: available from Horiba, Ltd.).

As is clear from Table 1, in Comparative Examples 1 and 2 including metal magnetic powders having an oxygen content of 0.4 wt. % and 0.7 wt. % respectively, the magnetic permeability was a high value of 75 in both cases, but the rate of change in thickness before and after the heat resistance test was extremely high in both cases, namely, +9.2% at 160 hours in Comparative Example 1 and +26.4% at 64 hours in Comparative Example 2.

Note that, in the present technology, when the oxygen content (thickness of the oxidized coating film) increased, the rate of change in the thickness before and after the test indicating heat resistance decreased (see Table 3 below). When the chelating agent was less than 1 part by weight and the oxygen content was less than approximately 0.7 wt. %, it was confirmed that the rate of change in the thickness before and after the test indicating heat resistance tended to be smaller as the oxygen content (thickness of the oxidized coating film) increased.

On the other hand, in Comparative Examples 3 and 4 including metal magnetic powders having an oxygen content of 1.2 wt. % and 1.5 wt. % respectively, while the magnetic permeability was 65 and 60 respectively, which are low values, the rate of change in the thickness of the sheets was extremely low even in heat resistance test for 1000 hours, namely+1.0% and +0.6%, and excellent heat resistance could be confirmed.

From this experiment, in cases where the oxidized coating film was relatively thick, the magnetic permeability was low, but the reaction between the metal magnetic powder and the chlorinated polyethylene was suppressed, and it was possible to suppress the generation of gas. Therefore, it can be surmised that even when the electromagnetic wave suppression sheet is exposed to a high temperature environment for a long period of time, the rate of change in the thickness can be kept low, or in other words, the electromagnetic wave suppression sheet excels in heat resistance.

Next, similarly, Sendust (Fe—Si—Al alloy) with a D50 (50% cumulative frequency) of from 32 to 52 μm which was atomized with an inert gas was subjected to a heating treatment (including a degreasing treatment) for 3.5 hours at a temperature of approximately 600 degrees in an oxygen containing atmosphere, and a metal magnetic powder was obtained. Similar to Comparative Examples 1 to 4, the metal magnetic powder was then kneaded with chlorinated polyethylene and a phosphorous-based anti-aging agent, and further, a phosphorous-based chelating agent was added at the compounding ratio below and kneaded. The mixture was shaped into a sheet to thereby produce an electromagnetic wave suppression sheet (Example 1).

Chlorinated polyethylene: 100 parts by weight
Metal magnetic powder: 500 parts by weight
Phosphorous-based anti-aging agent: from 1 to 10 parts by weight
Phosphorous-based chelating agent: 12 parts by weight The magnetic permeability of the produced sheet was measured, and then heat resistance test was performed for 1000 hours in a high temperature atmosphere at 105 degrees. In addition, a typical sample (Comparative Example 5) not containing a chelating agent but containing a typical metal magnetic powder (Sendust (Fe—Si—Al alloy) with a D50 (50% cumulative frequency) of from 33 to 55 μm which is atomized with an inert gas) not subjected to an oxidation treatment was produced, the magnetic permeability was measured, and the same heat resistance test was performed. The tensile strength was measured for the samples of Example 1 and Comparative Example 5.

The measurement results are shown in Table 2 and the Drawing.

TABLE 2

| | Metal Magnetic Powder | | Compounding | | | |
|---|---|---|---|---|---|---|
| | 600° C. Heating Duration (h) | Oxygen Content (wt. %) | Compounding Ratio (parts by weight) | Ratio of Chelating Agent (parts by weight) | Magnetic Permeability (1 MHz) | Duration for 105° C. Heat Resistance Test (h) | Thickness Change Rate (%) |
| Example 1 | 3.5 | 1.1 | 500 | 12 | 75 | 1000 | +4.2 |
| Comparative Example 5 | — | <0.1 | 500 | 0 | 75 | 1000 | +32.0 |

As shown in Table 2, with the sample of Example 1, for which the metal magnetic powder was provided with an oxidized coating film and a chelating agent was blended therein, magnetic permeability in the same level as that of Comparative Example 5 (typical product) can be ensured. Meanwhile, the rate of change in the thickness of the sheet after 1000 hours of heat resistance testing was significantly reduced to +4.2% compared to +32% of Comparative Example 5 (typical product).

Furthermore, with regard to tensile strength, as illustrated in the Drawing, the tensile strength of Example 1 did not differ much from that of Comparative Example 5 (typical product) at 1000 hours after the start of the heat resistance testing. However, midway through the heat resistance testing, and particularly between 400 hours and 1000 hours, the tensile strength of Comparative Example 5 increased rapidly, whereas the tensile strength of Example 1 increased gradually, and it was confirmed that flexibility can be ensured over an extended period of time.

The tensile strength of Comparative Example 5 shown in Table 2 increased due to impaired flexibility and increased hardness as a result of degradation of the sample before reaching the peak, after which the tensile strength decreased due to embrittlement of the sample as a result of degradation. That is, after 100 hours elapsed, even though the tensile strength of Example 1 and the tensile strength of Comparative Example 5 were numerically the same, the properties of the samples were completely different, and the sample of Comparative Example 5 could not retain its shape.

Next, similarly, Sendust (Fe—Si—Al alloy) with a D50 (50% cumulative frequency) of from 33 to 55 μm which was atomized by an inert gas was subjected to a heating treatment (including a degreasing treatment) for 2 hours at a temperature of approximately 600 degrees in an oxygen containing atmosphere, and a metal magnetic powder was obtained. Similar to Comparative Examples 1 to 4, a prescribed amount of the metal magnetic powder was then kneaded with chlorinated polyethylene and a phosphorous-based anti-aging agent, and further, a prescribed amount of a phosphorous-based chelating agent was added at the compounding ratio shown in Table 3 and kneaded. The mixture was shaped into a sheet to thereby produce respective electromagnetic wave suppression sheets (Examples 2 to 7 and Comparative Examples 6 to 19).

Chlorinated polyethylene: 100 parts by weight
Metal magnetic powder: from 350 to 650 parts by weight
Phosphorous-based anti-aging agent: from 1 to 10 parts by weight
Phosphorous-based chelating agent: from 0.8 to 15.5 parts by weight The magnetic permeability of the produced sheets was measured, and then heat resistance test was performed for 1000 hours in a high temperature atmosphere at 105 degrees. The results are also shown in Table 3.

As shown in Table 3, a high magnetic permeability of 75 was obtained in each of Examples 2 to 7, in which a metal magnetic powder provided with an oxidized coating film was blended at a ratio of 400 or 600 parts by weight, and the chelating agent was blended at a ratio from 1 to 15 parts by weight, per 100 parts by weight of the chlorinated polyethylene. Furthermore, the rate of change in the thickness of the sheets after 1000 hours of heat resistance testing of the Examples 2 to 7 was significantly reduced to a range of from +0.6% to +4.8% compared to +32% of Comparative Example 5 (typical product).

Note that Comparative Examples 6, 10, 12 and 14, in which the compounding ratio of the metal magnetic powder was low, namely 350 parts by weight, exhibited magnetic permeability of 60, which was obviously lower than that of Examples 2 to 7. In Comparative Examples 6 to 8, in which the compounding ratio of the chelating agent was a low value of 0.8 parts by weight, the rate of change in the thickness before and after the heat resistance test was large, ranging from +9.5% to +30.5%. Furthermore, shaping into a sheet was not possible for Comparative Examples 9, 11, 13, 15 and 19, in which the compounding ratio of the metal magnetic powder was a large value of 650 parts by weight, or for Comparative Examples 16 to 19, which contained a large amount, namely 15.5 parts by weight, of the chelating agent.

From the above experimental results, it is clear that the electromagnetic wave suppression sheet preferably contains from 400 to 600 parts by weight of a metal magnetic powder

TABLE 3

| | Metal Magnetic Powder | | Compounding | | | | |
| --- | --- | --- | --- | --- | --- | --- | --- |
| | 600° C. Heating Duration (h) | Oxygen Content (wt. %) | Compounding Ratio (parts by weight) | Ratio of Chelating Agent (parts by weight) | Magnetic Permeability (1 MHz) | Duration for 105° C. Heat Resistance Test (h) | Thickness Change Rate (%) |
| Comparative Example 6 | 2 | 0.7 | 350 | 0.8 | 60 | 1000 | +9.5 |
| Comparative Example 7 | 2 | 0.7 | 400 | 0.8 | 75 | 1000 | +14.4 |
| Comparative Example 8 | 2 | 0.7 | 600 | 0.8 | 75 | 1000 | +30.5 |
| Comparative Example 9 | 2 | 0.7 | 650 | 0.8 | — | — | — Not Formed |
| Comparative Example 10 | 2 | 0.7 | 350 | 1.0 | 60 | 1000 | +4.3 |
| Example 2 | 2 | 0.7 | 400 | 1.0 | 75 | 1000 | +4.5 |
| Example 3 | 2 | 0.7 | 600 | 1.0 | 75 | 1000 | +4.8 |
| Comparative Example 11 | 2 | 0.7 | 650 | 1.0 | — | — | — Not Formed |
| Comparative Example 12 | 2 | 0.7 | 350 | 10 | 60 | 1000 | +3.8 |
| Example 4 | 2 | 0.7 | 400 | 10 | 75 | 1000 | +4.0 |
| Example 5 | 2 | 0.7 | 600 | 10 | 75 | 1000 | +4.3 |
| Comparative Example 13 | 2 | 0.7 | 650 | 10 | — | — | — Not Formed |
| Comparative Example 14 | 2 | 0.7 | 350 | 15 | 60 | 1000 | +0.3 |
| Example 6 | 2 | 0.7 | 400 | 15 | 75 | 1000 | +0.6 |
| Example 7 | 2 | 0.7 | 600 | 15 | 75 | 1000 | +0.8 |
| Comparative Example 15 | 2 | 0.7 | 650 | 15 | — | — | — Not Formed |
| Comparative Example 16 | 2 | 0.7 | 350 | 15.5 | — | — | — Not Formed |
| Comparative Example 17 | 2 | 0.7 | 400 | 15.5 | — | — | — Not Formed |
| Comparative Example 18 | 2 | 0.7 | 600 | 15.5 | — | — | — Not Formed |
| Comparative Example 19 | 2 | 0.7 | 650 | 15.5 | — | — | — Not Formed | having an oxidized coating film and from 1 to 15 parts by weight of a chelating agent, per 100 parts by weight of chlorinated polyethylene.

According to the electromagnetic wave suppression sheet of the present technology, an electromagnetic wave suppression sheet excelling in both heat resistance and magnetic permeability can be obtained. Such an electromagnetic wave suppression sheet of the present technology can be used in electronic devices such as mobile phones and digital cameras.

The present technology is not limited to the embodiments described above, and various changes and modifications can be made without departing from the spirit and scope of the present technology. Accordingly, the following claims are appended to disclose the scope of the present technology.

The invention claimed is:

1. An electromagnetic wave suppression sheet comprising:
   (A) 100 parts by weight of chlorinated polyethylene;
   (B) from 400 to 600 parts by weight of a metal magnetic powder having an oxidized coating film formed on a surface thereof; and
   (C) from 1 to 15 parts by weight of a phosphorous-based chelating agent; wherein
   an oxygen content of the metal magnetic powder is from 0.4 to 1.1 wt. %.

2. The electromagnetic wave suppression sheet according to claim 1, further comprising from 1 to 10 parts by weight of an anti-aging agent.

* * * * *